（12） United States Patent
Takahashi

(10) Patent No.: US 7,649,800 B2
(45) Date of Patent: Jan. 19, 2010

(54) LOGIC CIRCUIT AND WORD-DRIVER CIRCUIT

(75) Inventor: Hiroyuki Takahashi, Kanagawa (JP)

(73) Assignee: Nec Electronics Corporation, Kanagawa (JP)

( * ) Notice: Subject to any disclaimer, the term of this patent is extended or adjusted under 35 U.S.C. 154(b) by 0 days.

(21) Appl. No.: 11/304,718

(22) Filed: Dec. 16, 2005

(65) Prior Publication Data

US 2006/0158953 A1      Jul. 20, 2006

(30) Foreign Application Priority Data

Dec. 22, 2004   (JP) .............................. 2004-371115

(51) Int. Cl.
*G11C 8/00* (2006.01)
(52) U.S. Cl. .............................. 365/230.06; 365/185.23
(58) Field of Classification Search ............. 365/230.06
See application file for complete search history.

(56) References Cited

U.S. PATENT DOCUMENTS

| | | | | |
|---|---|---|---|---|
| 5,590,079 A * | 12/1996 | Lee et al. .................... | 365/201 |
| 5,598,111 A * | 1/1997 | Enomoto ..................... | 326/83 |
| 6,222,780 B1 * | 4/2001 | Takahashi .............. | 365/189.09 |
| 2004/0047173 A1 * | 3/2004 | Kang ......................... | 365/145 |
| 2004/0252573 A1 * | 12/2004 | Hanson et al. .............. | 365/229 |
| 2006/0133185 A1 * | 6/2006 | Miller et al. ........... | 365/230.06 |

FOREIGN PATENT DOCUMENTS

JP       2590681       12/1996

\* cited by examiner

*Primary Examiner*—Hoai V Ho
*Assistant Examiner*—Anthan T Tran
(74) *Attorney, Agent, or Firm*—Young & Thompson

(57) ABSTRACT

Disclosed is a logic circuit which includes first and second MOS transistors which are connected in series between a first signal-input terminal and GND. The gates of the first and second MOS transistors are connected in common to a second signal-input terminal and a connection node between the drains of the first and second MOS transistors is connected to an output terminal. When the first and second MOS transistors are both in an off state, the output terminal is less than or equal to a low level.

14 Claims, 9 Drawing Sheets

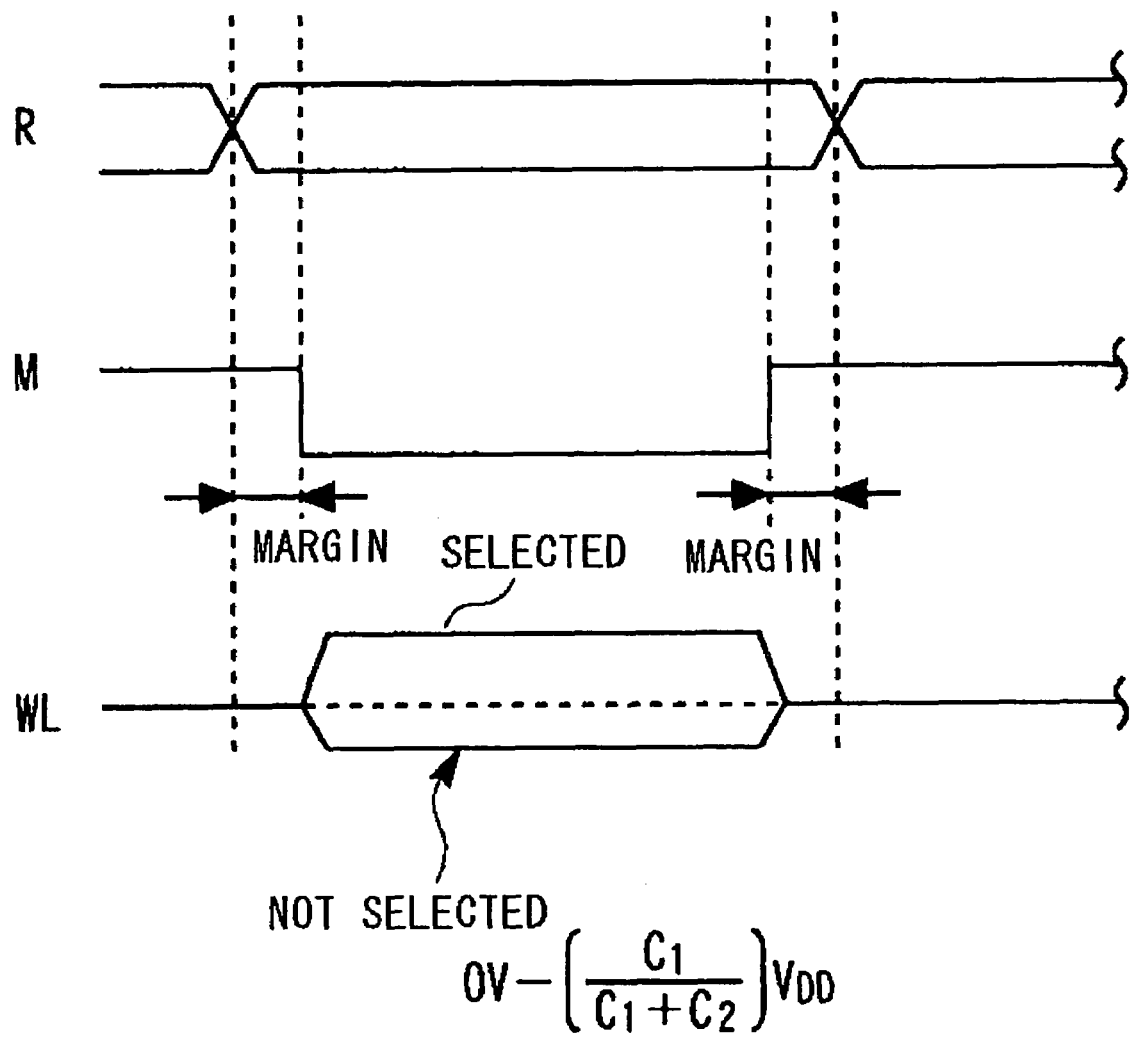

1 ; WORD DRIVER

2 ; MEMORY CELL

LOGIC CIRCUIT AND WORD-DRIVER CIRCUIT

BACKGROUND OF THE INVENTION

This invention relates to a logic circuit, and more particularly to a logic circuit suitably applied to a word driver circuit for driving a decoder circuit or word line.

FIELD OF THE INVENTION

FIG. 8 is a diagram showing an example of the configuration of a conventional word driver (refer to patent document 1). Referring to FIG. 8, the word driver circuit 1 comprises PMOS transistors P11 and P12 and NMOS transistors N11 and N12. The PMOS transistor P11 has a source connected to the power supply VCC and has a gate connected to a first signal-input terminal R. The PMOS transistor P12 has a source is connected to a drain of the PMOS transistor P11 and has a gate connected to a second signal-input terminal M. The NMOS transistors N11 and N12 have sources connected in common to ground (GND), have drains connected in common to a drain of the PMOS transistor P12 and have gates connected to first and second signal-input terminals R and M, respectively. The connection node between the drain of the PMOS transistor P12 and the drains of the NMOS transistors N11 and N12 is an output terminal W which is connected to a word line WL. A memory cell 2 for one ROW is connected to the word line WL. For simplification, FIG. 8 shows only one memory cell 2 of SRAM (Static Random Access Memory).

Referring to FIG. 8, the memory cell 2 typically comprises NMOS transistors N23 and N24 and a flip-flop composed by two inverters, each one of which has an output connected to an input of the other. The NMOS transistors N23 and N34 have gates connected to the word line WL, and are connected between a complimentary bit-line pair B and /B and the input and output of the flip-flop. The NMOS transistors N23 and N34 operate as transfer switches. More specifically, the flip-flop comprises a first CMOS inverter comprising a PMOS transistor P21 and a NMOS transistor N21 which are connected in series between the power supply and GND, and a second CMOS inverter comprising a PMOS transistor P22 and NMOS transistor N22 which are connected in series between the power supply and GND. The gates of the PMOS transistor P21 and NMOS transistor N21, which function as an input of the first CMOS inverter are connected in common to a connection node between the drains of the PMOS transistor P22 and NMOS transistor N22, which function as the output of the second CMOS inverter, while the gates of the PMOS transistor P22 and NMOS transistor N22 which function as the input of the second CMOS inverter are connected in common to a connection node between the drains of the PMOS transistor P21 and transistor N21, which function as the output of the first CMOS inverter. A circuit may well be adapted have a configuration in which resistance elements are used instead of the PMOS transistors P21 and P22 as load elements.

The memory cell 2 as a matter of course is not limited to the configuration shown In FIG. 8. For example, the memory cell 2 connected to the word line WL can also be a DRAM (Dynamic Random Access Memory) cell comprising a transistor and a capacitor, in which the transistor has a gate connected to the word line, and has one of drain and source connected to the bit line, and in which the capacitor is connected to the other of drain and source of the transistor not connected to the bit line.

The operation of the word driver circuit 1 shown in FIG. 8 will be described below.

When the first and second signal-input terminals R and M are both low, the PMOS transistors P11 and P12 are both turned on, and the NMOS transistors N11 and N12 are both turned off, as a result of which the word line WL becomes high.

When the first and second signal-input terminals R and M are low and high, respectively, the PMOS transistor P11 and NMOS transistor N12 are turned on, and the PMOS transistor P12 and the NMOS transistor N11 are turned off, as a result of which the word line WL becomes low.

When the first and second signal-input terminals R and M are high and low, respectively, the PMOS transistor P11 and the NMOS transistor N12 are turned off, and the PMOS transistor P12 and the NMOS transistor N11 are turned on, as a result of which the word line WL becomes low.

When the first and second signal-input terminals R and M are both high, the PMOS transistors P11 and P12 are both turned off and NMOS transistors N11 and N12 are both turned on, as a result of which the word line WL becomes low.

As described above, the word driver circuit shown in FIG. 8 performs a logic operation equivalent to that of a NOR circuit.

In Patent document 1, there is disclosed a circuit configuration of a two-input logic circuit device, in which one of the input signals is connected to a source of a MOS transistor, thereby increasing the speed of the delay time of the logic circuit and reducing the area of the logic circuit by decreasing the number of elements. FIG. 9 is a diagram illustrating the configuration of the logic circuit disclosed in Patent document 1.

Referring to FIG. 9, the logic circuit comprises a PMOS transistor P31 and NMOS transistors N31 and N32. The PMOS transistor P31 has a source and a gate connected to first and second signal-input terminals R and M, respectively and has a drain connected to an output-signal terminal W. The NMOS transistor N31 has a source connected to a low-potential power supply terminal GND, and has a drain connected to the output terminal W. The NMOS transistor N32 has a source connected to GND, has a gate connected to a high-potential power supply terminal VCC, and has a drain connected to the output terminal W. In case wherein the logic-circuit device shown in FIG. 9 is a sub-word driver circuit (a driver circuit for driving a sub-word line), the power supply voltage for driving the main word line is supplied to the second signal-input terminal M, and the power supply voltage for driving the word line when selected is supplied to the first signal-input terminal R.

The operation of the logic-circuit device shown in FIG. 9 will be described below.

When the first signal-input terminal R is low, the PMOS transistor P31 is in an off state. With the PMOS transistor P31 being in an state, when the second signal-input terminal M is high, the NMOS transistor N31 is in an on state, so that the output terminal W becomes low.

When the first and second signal-input terminals R and M are both low, the PMOS transistor P31 and NMOS transistor N31 are both in an off state, and since the NMOS transistor N32 is always in an on state, the output terminal W becomes low, without being set into a floating state.

When the first and second signal-input terminals R and M are both high, the PMOS transistor P31 is turned off, and both the NMOS transistors N11, N12 are turned on, as a result of which the output terminal W becomes low.

When the first and second signal-input terminals R and M are high and low, respectively, the PMOS transistor P32 and NMOS transistor N32 are both turned on and the NMOS transistor N31 is turned off. In case the size of the NMOS transistor N32 is made sufficiently smaller than that of the PMOS transistor P31, and the resistance component of NMOS transistor N32 in an on state is sufficiently large, the output terminal W outputs a high-level output signal.

In other words, logic operation equivalent to a decoder circuit is performed in which a high-level output signal is output only when the state of R=high and M=low is selected, otherwise a low-level signal is output. In the configuration shown in FIG. 9, since the number of elements is less than that of the configuration shown in FIG. 8, it is possible to reduce the space occupied by the circuit. Since there are no transistors connected in cascode connection, such as the transistors P11 and P12 shown in FIG. 8, it is possible to increase the speed of the propagation delay time.

[Patent Document 1] Japanese Patent No. 2590581 (FIGS. 1 and 6)

SUMMARY OF THE INVENTION

As a result of strong commitment and research, the inventor of the present invention has come up with a completely new proposal for the circuit configuration of a logic circuit which is capable of further reducing the number of elements and increasing speed as compared with the logic circuit shown in FIG. 9 which as described is for reducing the number of elements and for increasing speed.

The present invention described in this specification employs the following configuration.

A logic circuit according to one aspect of the present invention comprises: first and second input terminals for receiving respective signals supplied thereto; first and second transistors connected in series between said first input terminal and a first power supply; said first and second transistors having control terminals connected in common to said second input terminal; and an output terminal connected to a connection node between said first transistor and said second transistor. The output terminal is made less than or equal to a first logic level corresponding to the first power supply voltage, when said first and second transistors being both in an off state, responsive to the combination of the signals supplied to said first and second input terminals.

Preferably, in the present invention, when, with said output terminal being at the first logic level and the signal supplied to said first input terminal being kept at the first logic level, the signal supplied to said second input terminal changes from a second logic level corresponding to a second power supply voltage to the first logic level, said output terminal becomes less than said first logic level due to capacitive coupling between said control terminal and said output terminal. In the invention, there may be provided a pulse-generating circuit for detecting the transition of the signal supplied to the second input terminal, and for generating a pulse signal to supply the output from the pulse-generating circuit to a commonly connected node between the control terminals of the first and second transistors.

The word driver circuit in accordance with another aspect of the present invention comprises the aforementioned logic circuit, and the output terminal of the logic circuit is connected to a word line. In the word driver circuit according to the present invention, when the output terminal of the logic circuit is at the first logic level, the signal supplied to the first input terminal of the logic circuit is maintained at the first logic level, and when the signal supplied to the second input terminal of the logic circuit changes from the second logic level to the first logic level, the output terminal is at the first logic level or a negative potential due to capacitive coupling between the control terminals of the first and second transistors of the logic circuit and the output terminal.

The meritorious effects of the present invention are summarized as follows.

With the logic circuit according to one aspect of the present invention, it is possible to reduce the number of logic stages and the number of elements, and to increase speed.

With the word driver circuit according to another aspect of the present invention, when the output is in a high-impedance state, by making the output be lower than GND potential, it is possible to widen the noise immunity, and to improve noise resistance and reliability, when there is a floating in the word-line potential.

Still other features and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 3 is a diagram showing an example of the timing waveform of the word driver circuit shown in FIG. 2.

PREFERRED EMBODIMENTS OF THE INVENTION

Figure 1:
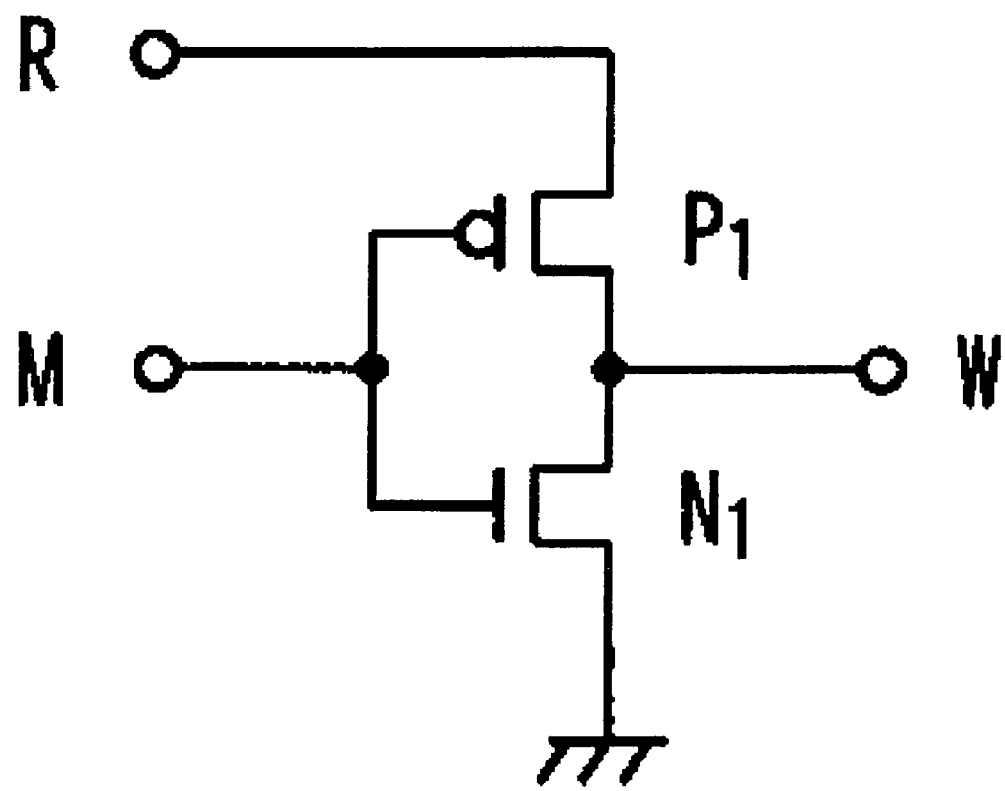
FIG. 1 is a diagram illustrating the configuration of an embodiment of the present invention.

The invention described above will be described in more detail with reference to the drawings. FIG. 1 is a diagram illustrating the configuration of a logic circuit of an embodiment of the present invention. Referring to FIG. 1, the logic circuit according the embodiment of the present invention comprises a PMOS transistor P1 and NMOS transistor N1. The PMOS transistor P1 has a source and a gate connected to a first signal-input terminal R and a second signal-input terminal M, respectively. The NMOS transistor N1 has a drain connected to the drain of the PMOS transistor P1, has a gate connected to the second signal-input terminal M and has a source is connected to a power supply GND. The operation (decoder operation) of the logic circuit shown in FIG. 1 will be described.

First, the case wherein the signal supplied to the first signal-input terminal R is high will be described. In this case, when the signal supplied to the second signal-input terminal M is low, the PMOS transistor P1 is turned on, the NMOS transistor N1 is turned off and the output terminal W becomes high. On the other hand, when the signal supplied to the second signal-input terminal M is high, the NMOS transistor N1 is turned on, the PMOS transistor P1 is turned off and the output terminal W becomes low. In other words, the circuit shown in FIG. 1 functions as a CMOS inverter such that when the first signal-input terminal R is high, the circuit inverts the logic level at the second signal-input terminal M and outputs the inverted signal from the output terminal W.

Next, the case wherein the signal supplied to the first signal-input terminal R is low will be described. In this case, when the signal supplied to the second signal-input terminal M is high, the PMOS transistor P1 is turned off, the NMOS transistor N1 is turned on and the output terminal W becomes low. When the signal supplied to the second signal-input terminal M is low, both the PMOS transistor P1 and NMOS transistor N1 are turned off, and the output is in a high-impedance state. At this time, if the output terminal W is low (GND potential, just before the transition of the signal at the second signal-input terminal M from high to low, the potential at the output terminal W becomes low or lower than the GND potential at the transition time of the second signal-input terminal M from high to low. In other words, when the second signal-input terminal M changes from high to low, the output terminal W becomes low or a negative potential (potential lower than GND potential), due to the capacitive coupling between the gate and drain of the PMOS transistor P1 and NMOS transistor N1.

In this way, the logic circuit shown in FIG. 1 decodes the respective signals supplied to the first and second signal-input terminals R and M and when the first and second signal-input terminals R and M are high and low, respectively, the circuit can be used as a decoder circuit that outputs a high-level output signal, or as a word driver circuit that will be described later.

Figure 2:
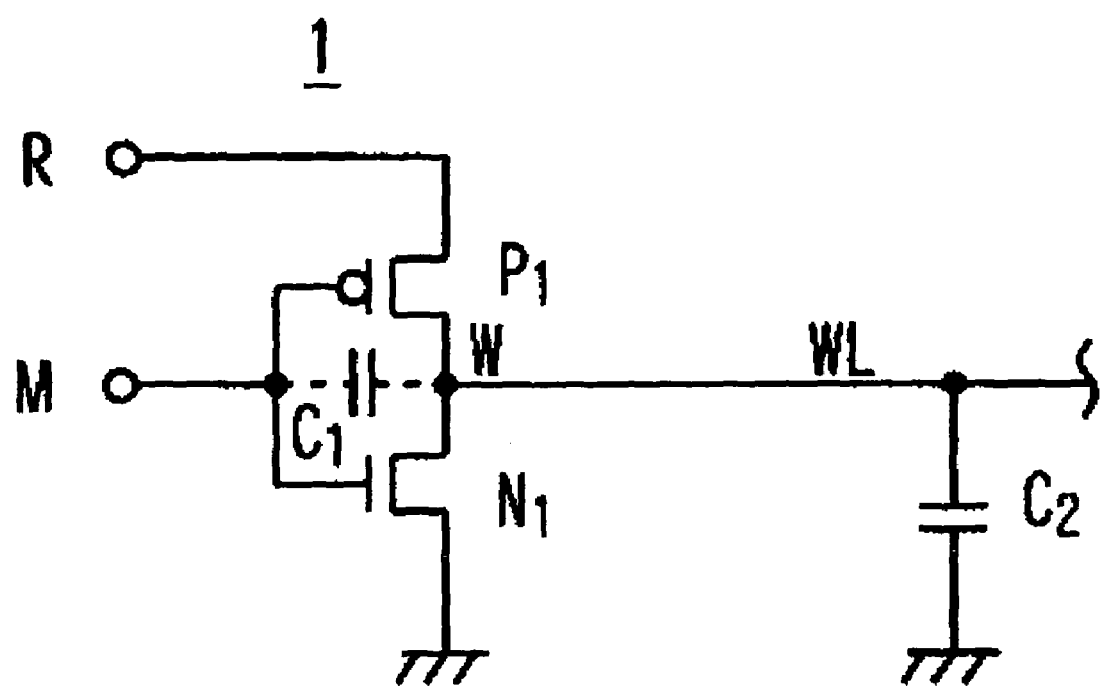
FIG. 2 is a drawing illustrating the configuration of a word driver circuit of an embodiment of the present invention.
Figure 8:
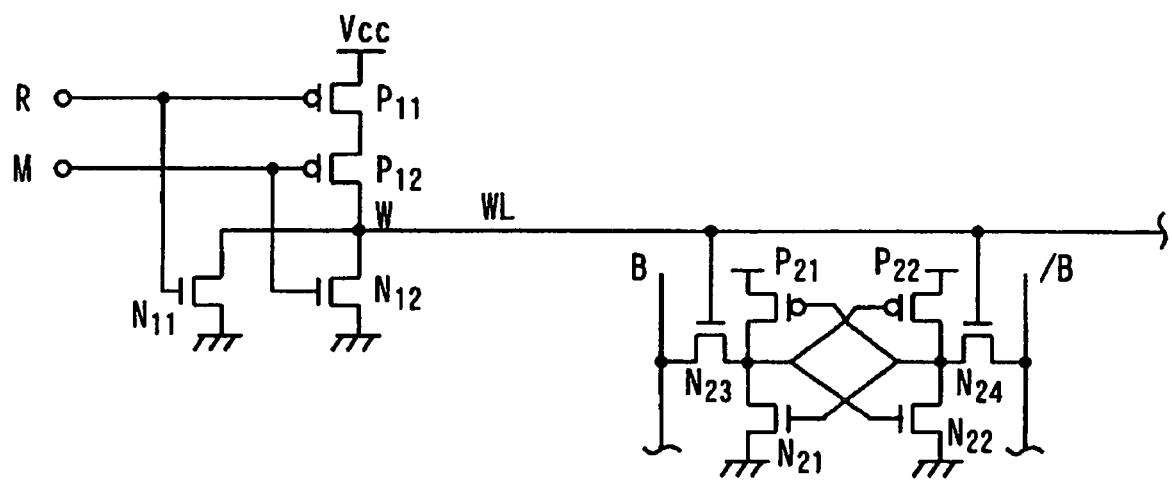
FIG. 8 is a diagram showing the configuration of a conventional word driver circuit.
Figure 9:
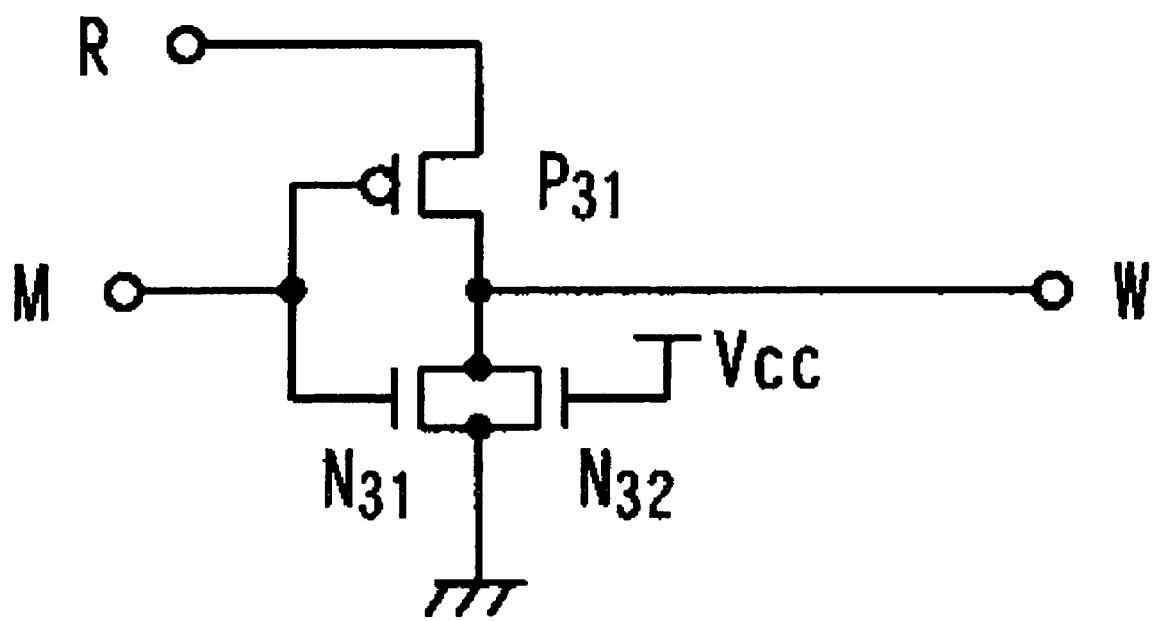
FIG. 9 is a diagram showing the configuration of the logic-circuit device disclosed in patent document 1.

FIG. 2 is a diagram illustrating the configuration of an embodiment in which the logic circuit of the present invention described with reference to FIG. 1 is applied to a word driver circuit. In FIG. 2, the logic circuit shown in FIG. 1 and the word line WL both are shown as an equivalent circuit, where the memory cell which is connected to the word line WL is not shown (refer to reference number 2 in FIG. 8, for the configuration of the memory cell). The configuration of the word driver circuit shown in FIG. 2 is the same as the configuration of the logic circuit shown in FIG. 1 and hence any redundant explanation is omitted in the below. FIG. 3 is a diagram showing the voltage waveform of the terminals R, M and word line WL of the word driver circuit shown in FIG. 2. The operation of the present embodiment of the present invention will be described with reference to FIG. 2 and FIG. 3.

As shown in FIG. 2, C1 designates a capacitor (capacitance component) between the commonly connected gates and commonly connected drains of the PMOS transistor P1 and NMOS transistor N1 and C2 designates a capacitance of the word line WL which is the load (capacitive load) of the output terminal W.

When the output terminal W (word line WL) is in the GND potential, and the second signal-input terminal M changes from high (power supply voltage VDD) to low (GND potential), the potential at the output terminal W becomes $0V - [C1/(C1+C2)] VDD$, due to the charge redistribution by the capacitance C2.

More specifically, just before the second signal-input terminal changes from the power supply voltage VDD to the GND potential, the terminal voltage of the capacitance C1 (terminal voltage on the gate side) is assumed to be the power supply voltage VDD, and the charge Q which is charged in the capacitance C1 is $C1*VDD$. When the terminal voltage of the capacitance C1 becomes the GND potential due to the transition of the second signal-input terminal M changes from high to low, the potential at the output terminal W become lower than the GND potential by just the amount of the potential which is derived by (charge−Q) divided by the combined capacitance (C1+C2), where Q is equal to $C1*VDD$.

In this way, the potential at a non-selected word line WL takes a negative potential (refer to the 'selected' word line WL shown in FIG. 3. Therefore, in the memory cell shown in FIG. 8, a negative potential is supplied to the gates of the NMOS transistors N23 and N24 of the memory cell connected to the word line WL, when not selected (refer to the 'not selected' word line WL shown in FIG. 3). Even though the rise of the potential by just the amount of the threshold voltage Vth of the NMOS transistors N23 and N24 may occur in a word line WL having negative potential, the NMOS transistors N23 and N24 are in an off state, and malfunction does not occur. In other words, when there is a rise of the potential in the word line due to noise or the like, the margin (noise allowance) is increased, which improves the noise immunity.

On the other hand, when the first and second signal-input terminals R and M are high and low, respectively, the output terminal W is at the power supply voltage VDD supplied to the first signal-input terminal, so that the word line connected to the output terminal W is in the selected state.

In the present embodiment, it is preferred that timing of the input signal to the second signal-input terminal M be controlled such that, after the output terminal W becomes low (GND potential) with the first and second signal-input terminals both high, the first signal-input terminal R is changed from high to low, and then the second signal-input is changed from high to low and the potential at the output terminal W become negative. As shown in FIG. 3, there is a preset timing margin allotted to at least the falling edge of the signal supplied to the second signal-input terminal M against the signal supplied to the first signal-input terminal R (see 'Margin' in FIG. 3). This will be described below with reference to FIG. 2 and FIG. 4.

Figure 4A:
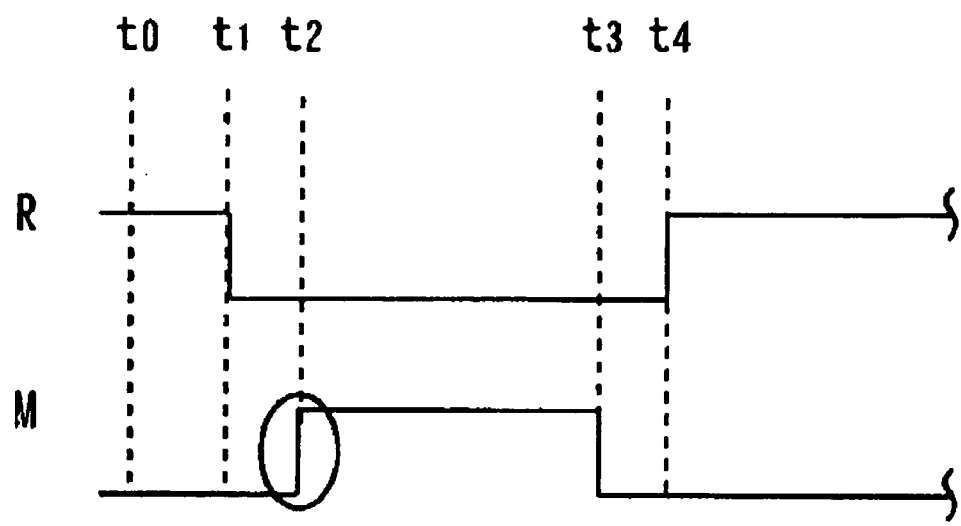
FIGS. 4A and 4B are drawings for explaining the theory of operation of an embodiment of the present invention.

The timing waveform shown in FIG. 4A is an example of timing control for which there is a possibility of malfunction of the word driver circuit 1 shown in FIG. 2. When the first and second signal-input terminals R and M are high and low, respectively (timing t0 in FIG. 4A), the output terminal W becomes high, and in this state, when the first signal-input terminal R transitions to low (timing t1 in FIG. 4A), the output is in a high-impedance state, and the output terminal W goes from the high level to Hi-Z (an intermediate potential in a floating state). Here, when the second signal-input terminal M transitions from low to high (timing t2 in FIG. 4A, the rising edge of M that is circled), the output terminal W changes from Hi-Z to low. However, at that time, in response to the rising edge of the second signal-input terminal M and due to the capacitive coupling of the capacitance C1, the output terminal W and the word line WL are raised to a high-level side, which could cause malfunction. More specifically, when timing control such as that shown in FIG. 4A is performed, there is a possibility that the transfer transistor in the memory cell of a non-selected word line will be turned on due to the potential rise of the non-selected word line WL caused by the capacitive coupling due to the rising edge of the second signal-input terminal M. At timing t3 in FIG. 4A, the second signal-input terminal transitions from high to low, and at the timing t4 when the first signal-input terminal R goes high, the output terminal W becomes high.

Figure 4B:
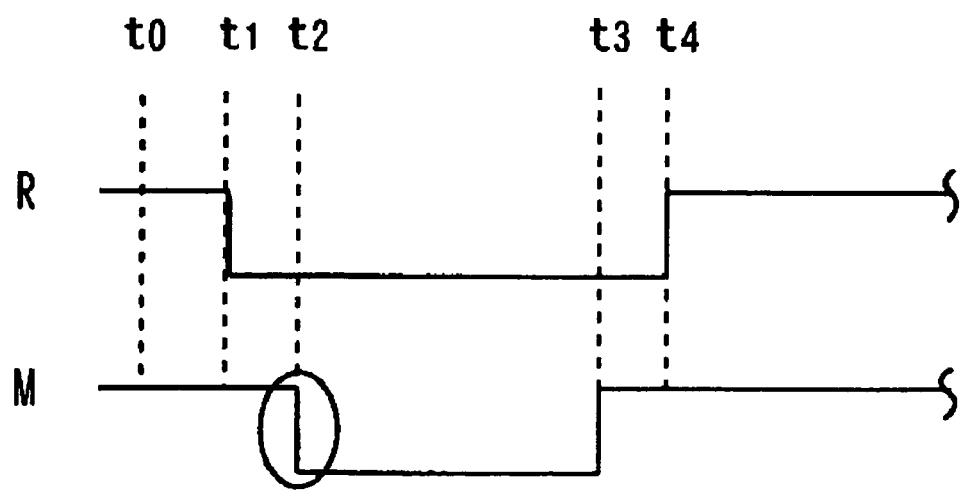

Accordingly, in the present embodiment, instead of the timing control shown in FIG. 4A, the timing shown in FIG. 4B is performed. In other words, with the first and second signal-input terminals R and M both high (timing t0 in FIG. 4B), the output terminal W is set low. Next, the first signal-input terminal R goes low (timing t1 in FIG. 4B), and after that the second signal-input terminal M goes low (timing t2 in FIG. 4B, the trailing edge of M that is circled). By doing this, the non-selected word line WL has negative potential. Also, the second signal-input terminal M changes from low to high (timing t3 in FIG. 4B), and after that, the first signal-input terminal R changes from low to high (timing t4 in FIG. 4B).

Figure 5:
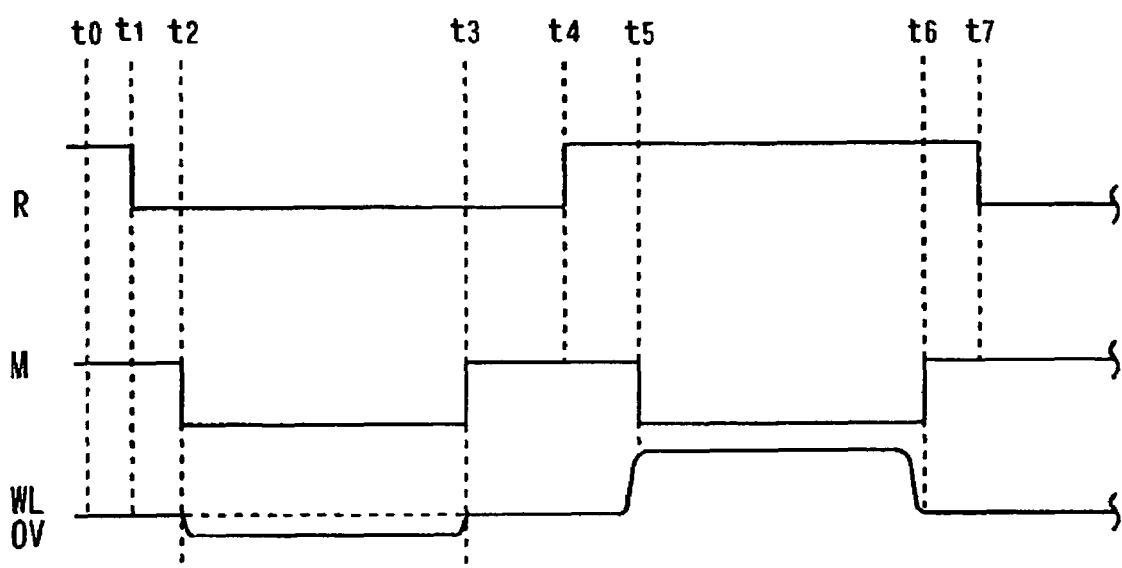
FIG. 5 is a drawing for explaining the timing operation of the word driver circuit of an embodiment of the present invention.

An example of the operation of a semiconductor-memory device comprising a word driver circuit 1 that performs the timing control described with reference to FIG. 4B will be described. FIG. 5 is a diagram showing an example of the operation waveform of the first signal-input terminal R, second signal-input terminal M and word line WL in the circuit shown in FIG. 2 (refer to FIG. 2). The word-line-drive-power supply voltage or GND potential is supplied to the first signal-input terminal R, and the signal (high level/low level) from an X decoder (not shown in the figure) is supplied to the second signal-input terminal M. Also, when used as a sub-word driver circuit, the main word line is connected to the second signal-input terminal M, and the word-line-drive-power supply voltage or GND potential is supplied to the first signal-input terminal R. When the memory cell connected to the word line WL is a DRAM cell, a boosted voltage higher than the power supply voltage VDD is supplied as the word-line-drive-power supply voltage.

When both the first and second signal-input terminals R and M high (timing t0), the output terminal W is at GND potential, and when the first signal-input terminal R changes from high (word-line-drive-power supply voltage) to low (timing t1), the output terminal W maintains the GND potential.

Next, when the second signal-input terminal M goes low (GND potential) (timing t2), the potential at the word line WL is made lower than the GND potential (non-selected state).

Then, when the second signal-input terminal M changes from low to high (timing t3), the potential at the word line WL is set to GND potential.

Next, the first signal-input terminal R changes from low to high (timing t4). At this time, since the second signal-input terminal M is high, the word line WL is low.

With the first and second signal-input terminals R and M being high and low, respectively (timing t5), and the word line WL becomes high.

When, with the first signal-input terminal R being high, the second signal-input terminal M goes high (timing t6), the word line WL falls to the GND potential.

When, with the second signal-input terminal M being high, the first signal-input terminal R changes from high to low (timing t7), the word line WL is at the GND potential.

Figure 6A:
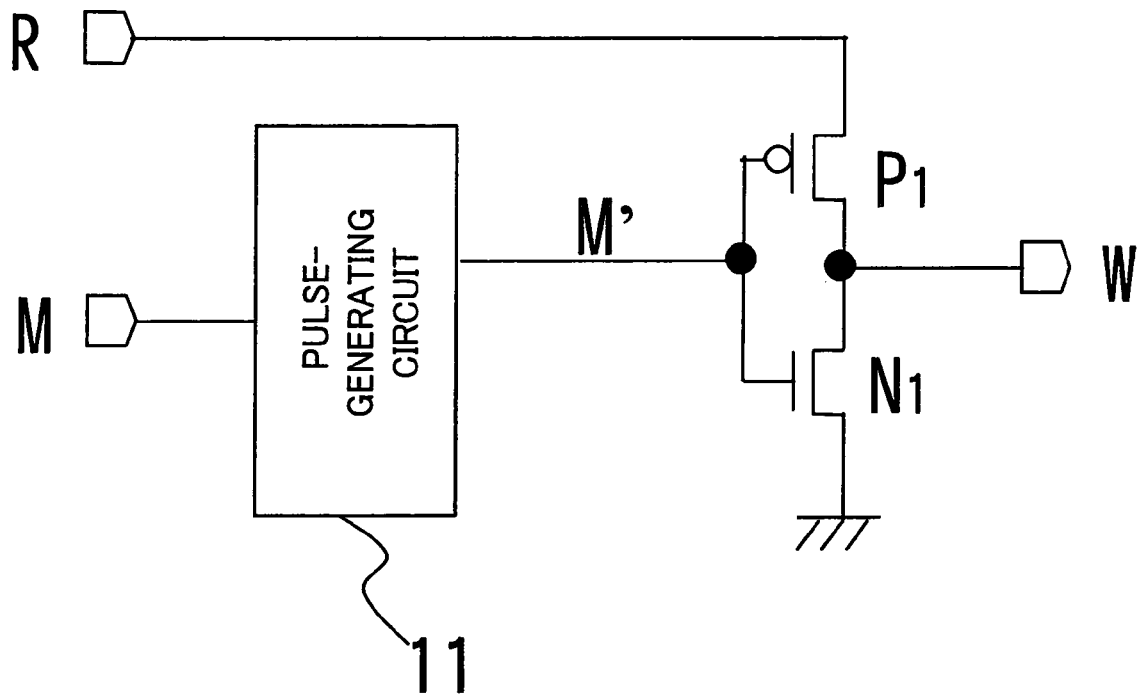
FIGS. 6A and 6B are drawings illustrating the configuration of another embodiment of the present invention.
Figure 6B:
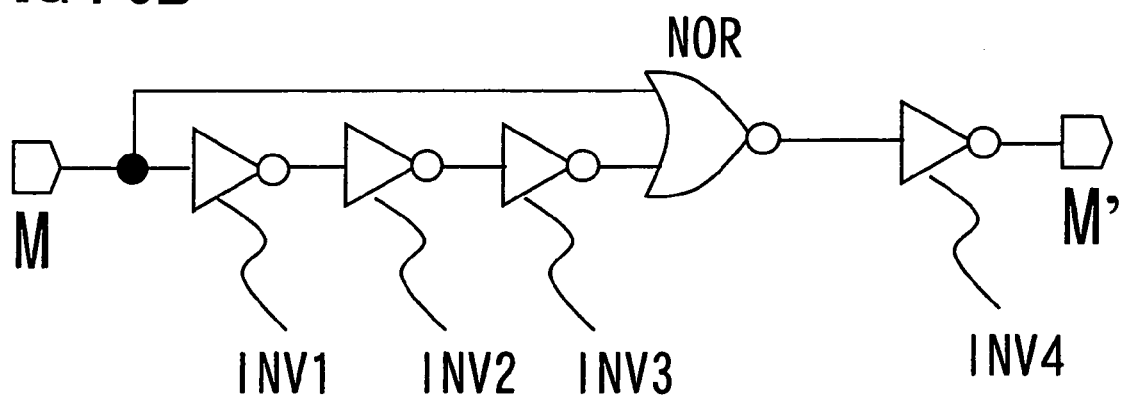

Next, another embodiment of the present invention will be described. FIG. 6A and FIG. 6B are diagrams showing the configuration of a logic circuit of a second embodiment of the present invention. Referring to FIG. 6A, this second embodiment of the present invention has a pulse-generating circuit 11 added to the configuration of the logic circuit shown in FIG. 1. An input of the pulse-generating circuit 11 is connected to the second signal-input terminal M, and an output M' of the pulse-generating circuit 11 is connected to the common gates of the PMOS transistor P1 and the NMOS transistor N1.

The pulse-generating circuit 11 responds, for example, to the change in the second signal-input terminal M from high to low to change the output M' from high to low. After maintaining low level for a preset period (pulse width), the pulse-generating circuit 11 changes the output M' from low to high.

FIG. 6B is a diagram showing an example of the configuration of the pulse-generating circuit 11 shown in FIG. 6A. Referring to FIG. 6B, the pulse-generating circuit 11 comprises an inverter array of an odd number of inverters, a two-input NOR circuit NOR, and an inverter INV4. In FIG. 6B, there are three stages of inverters INV1, INV2, and INV3. An input of the inverter INV1 is connected to the second signal-input terminal M and an output of the inverter INV3 is connected to one input of the two-input NOR circuit NOR, the other input of which is connected to the second signal-input terminal M. The inverter INV4 that inverts and outputs the output from the two-input NOR circuit NOR as output signal M'. The propagation delay time of the inverter array (INV1, INV2, and INV3) defines the pulse width. The inverter array is not limited to three inverters, and could be any odd number of inverters.

Next, the operation of the pulse-generating circuit shown in FIG. 6B will be described. Referring to FIG. 6B, when the second signal-input terminal M is high, the level of the output from the inverter array (INV1, INV2, and INV3) is low, the output from the two-input NOR circuit NOR is low, and the output M' from the inverter INV4 is high.

When the second signal-input terminal M changes from high to low, the output signal from the inverter INV3 is low until after the propagation delay time of the inverter array (INV1, INV2, and IN3) elapses, so that the output signal from the two-input NOR circuit NOR is high, and the output M' from the inverter INV4 changes from high to low.

Also, after the propagation delay time of the inverter array (INV1, INV2, and INV3) elapses starting from when the second signal-input terminal M changes from high to low, the output from the inverter INV3 changes from low to high. In response to this transition, the output from the two-input NOR circuit NOR changes from high to low, and the output M' from the inverter INV4 changes from low to high.

Figure 7:
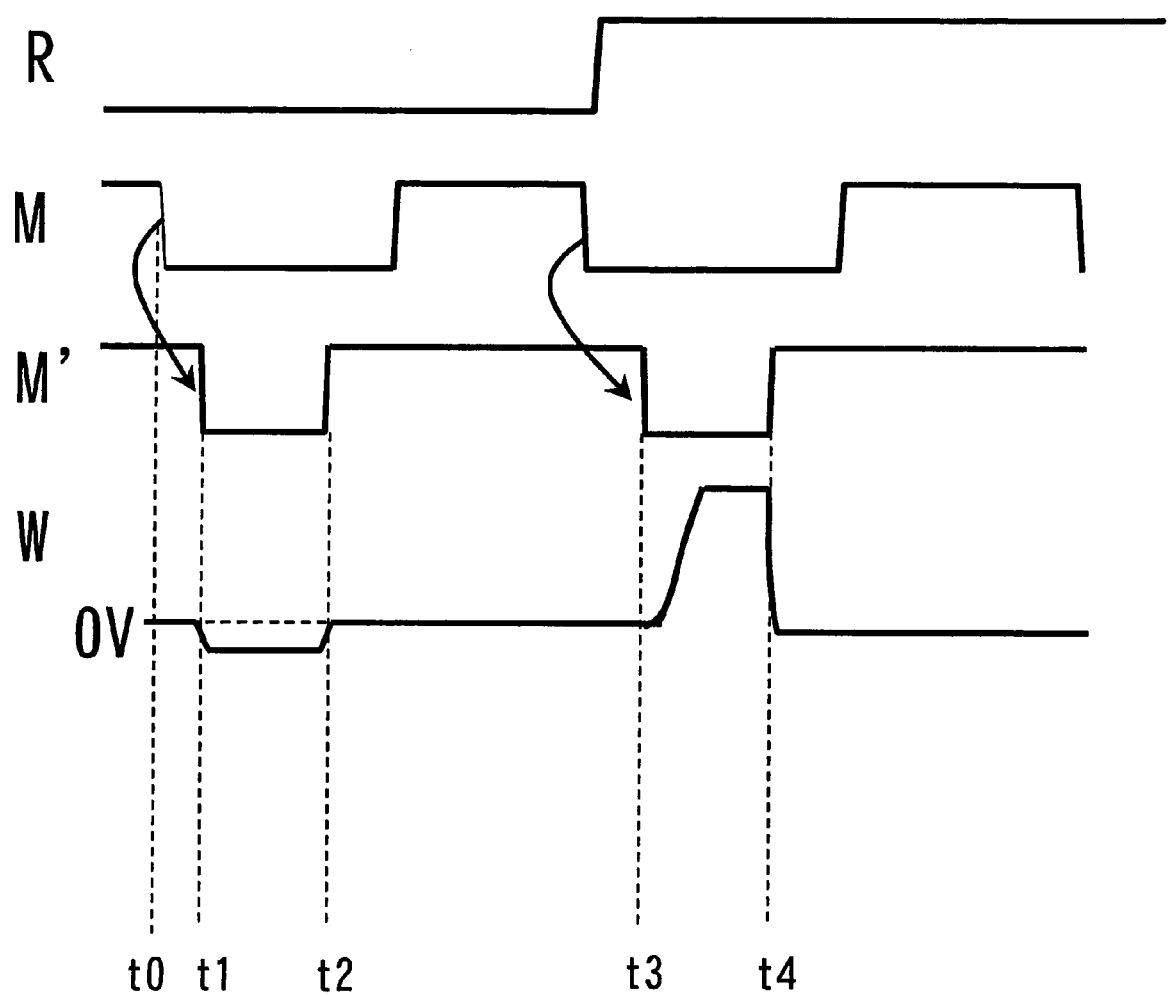
FIG. 7 is a drawing for explaining the timing operation of another embodiment of the present invention.

FIG. 7 is a diagram showing the timing waveform for explaining the operation of the logic circuit (or word driver circuit) shown in FIGS. 6A and 6B. As described above, when the first signal-input terminal R is low, the output terminal W is at GND potential and the output M' from the pulse-generating circuit 11 supplied to the common gates of the PMOS transistor P1 and NMOS transistor N1 becomes low (GND potential), the output terminal W becomes less than GND potential (negative potential) due to capacitive coupling between the gate and drain (refer to timing t1 to t2).

On the other hand, when the first signal-input terminal R is high and the output M' from the pulse-generating circuit 11 is low (GND potential), the level of the output terminal W becomes high (or boosted potential) (refer to timing t3 to t4).

In FIG. 7, after the propagation delay time of the two-input NOR circuit NOR and inverter INV4 shown in FIG. 6B has elapsed from the timing to of the second signal-input signal M changing from high to low, the output M' changes from high to low at timing t1. The period (pulse width) of the output M' being low corresponds to the propagation time of the inverter array (INV1, INV2, and INV3).

When the signals supplied to the first signal-input terminal R and second signal-input terminal M are both static signals, the logic circuit of this second embodiment of the present invention detects the transition of the second signal-input terminal M from high to low to generate and output a pulse, in response to the detection. The starting position (t1 in FIG. 7) and pulse width (t1 to t2 in FIG. 7) of the pulse of the output M' can be adjusted by the pulse-generating circuit 11. Of course it is possible to change the delay time of the delay circuit array of the inverter array (INV1 to INV3) shown in FIG. 6B. The logic circuit of this second embodiment of the present invention described with reference to FIG. 6 and FIG. 7 can also be applied as the word driver circuit shown in FIG. 2.

The present invention was described according to the embodiments described above, however, the invention is not limited to the configuration of the aforementioned embodiments, and the scope of the present invention may include various changes or modifications that could be made by someone skilled in the art.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A logic circuit, comprising:
   exactly two transistors, said two transistors being a first transistor and a second transistor,
   first and second input terminals for receiving different logic input signals supplied thereto respectively from first and second input signal sources, each logic signal changing between a low state and a high state, said first input terminal being connected exclusively to the first input signal source and to said first transistor;
   said first and second transistors connected in series between said first input terminal and a first power supply, said first and second transistors having control terminals connected in common to said second input terminal; and
   an output terminal connected to a connection node between said first transistor and said second transistor,
   said logic circuit structured to have a first operational configuration wherein said output terminal is made to be at a first logic level, the first logic level being less than or equal to the first power supply voltage, when said first and second transistors being both in an off state, responsive to the combination of the signals supplied to said first and second input terminals so that when the signals supplied to both said first and second input terminals are low, a potential at said output terminal becomes the first logic level, and
   said logic circuit structured to as a CMOS inverter so that when the first input terminal is in a high state, the logic circuit inverting a logic level at the second input terminal and outputting the inverted signal from the output terminal.

2. The logic circuit according to claim 1,
   further comprising:
   capacitive coupling between said control terminal and said output terminal so that said logic circuit structured to have an operational configuration wherein, when, with said output terminal being at the first logic level and the signal supplied to said first input terminal being kept at the first logic level, the signal supplied to said second input terminal changes from a second logic level corresponding to a second power supply voltage to the first logic level, said output terminal is made less than said first logic level due to the capacitive coupling between said control terminal and said output terminal.

3. The logic circuit according to claim 2, wherein the signals supplied to said first and second input terminal are timing-controlled such that
   (a) when the signals supplied to both said first and second input terminals are at said second logic level, said output terminal is at said first logic level;
   (b) next, with the signal supplied to said second input terminal being at said second logic level, the signal supplied to said first input terminal changes from said second logic level to said first logic level; and
   (c) next, the signal supplied to said second input terminal changes from said second logic level to said first logic level, and at that time, said output terminal is at said first logic level or a negative potential due to the capacitive coupling between said control terminal and said output terminal.

4. A word driver circuit comprising the logic circuit as set fourth in claim 1, wherein;
   said logic circuit, having said output terminal connected to a word line, drives said word line.

5. The word driver circuit according to claim 4, wherein the signals supplied to said first and second input terminals of said logic circuit, respectively, are such that, after the level of said first input terminal of said logic circuit changes from said second logic level corresponding to said second power supply voltage to said first logic level, said second input terminal of said logic circuit changes from said second logic level to said first logic level.

6. The word driver circuit according to claim 5, wherein, when, with said output terminal of said logic circuit being at said first logic level, and the signal supplied to said first input terminal of said logic circuit being kept at said first logic level, the signal supplied to said second input terminal of said logic circuit changes from said second logic level to said first logic level, said output terminal becomes said first logic level or a negative potential due to capacitive coupling between said control terminals of said first and second transistors of said logic circuit and said output terminal.

7. The word driver circuit according to claim 5, wherein the signals supplied to said first and second input terminals of said logic circuit, respectively, are such that after the level of said second input terminal of said logic circuit changes from said first logic level to said second logic level, the level of said first input terminal of said logic circuit changes from said first logic level to said second logic level.

8. The word driver circuit according to claim 4, wherein said first transistor comprises a PMOS transistor, and said second transistor comprises a NMOS transistor.

9. A semiconductor-memory device comprising the word driver circuit as set forth in claim 8.

10. The logic circuit according to claim 1, further comprising:
    a pulse generating circuit having an input end for receiving the signal supplied to a second input terminal,
    said pulse generating circuit arranged to a preset transition of the signal supplied to said second input terminal, to generate a pulse signal in response to the detection of said transition, and the pulse signal from an output end thereof;
    said first and second transistors having control terminals connected in common to the output end of said pulse generating circuit;
    wherein, said first and second transistors are configured such that in the off state according to the combination of the signals supplied to said first and second input terminals, the potential at said output terminal is less than or equal to the first logic level corresponding to said first power supply voltage.

11. The logic circuit according to claim 10, said first and second transistors and said pulse generating circuit arranged such that:

when detecting the transition of the signal supplied to said second input terminal from the second logic level corresponding to a second power supply voltage to the first logic level, said pulse generating circuit generates a pulse signal at said first logic level for a predetermined period starting from a preset pulse starting position and outputs the so generated pulse signal from the output end; and when, with said output terminal being at said first logic level, and the signal supplied to said first input terminal being kept at said first logic level, the output from said pulse generating circuit changes from said second logic level to said first logic level, said output terminal becomes less than or equal to said first logic level due to capacitive coupling between said control terminal and said output terminal.

12. The logic circuit according to claim 1, wherein, with the signals supplied to both said first and second input terminals being low, the potential at said output terminal becomes 0V or less.

13. The logic circuit according to claim 1, wherein, with the signal supplied to said first input terminal being low, the signal supplied to said second input terminal changing from high to low makes the potential at said output terminal become 0V or less.

14. The logic circuit according to claim 1, wherein, with the signal supplied to said first input terminal being low, the signal supplied to said second input terminal changing from high to low makes the potential at said output terminal become less than 0V.

* * * * *